United States Patent
Yoo et al.

(10) Patent No.: US 7,253,451 B2
(45) Date of Patent: Aug. 7, 2007

(54) III-NITRIDE SEMICONDUCTOR LIGHT EMITTING DEVICE

(75) Inventors: Tae-Kyung Yoo, Yongin-si (KR); Eun Hyun Park, Seongnam-si (KR)

(73) Assignee: EPIVALLEY Co., Ltd., Kyunggi-Do (KR)

( * ) Notice: Subject to any disclaimer, the term of this patent is extended or adjusted under 35 U.S.C. 154(b) by 169 days.

(21) Appl. No.: 10/544,328

(22) PCT Filed: Jun. 28, 2005

(86) PCT No.: PCT/KR2005/002027

§ 371 (c)(1),
(2), (4) Date: Aug. 3, 2005

(87) PCT Pub. No.: WO2006/057485

PCT Pub. Date: Jun. 1, 2006

(65) Prior Publication Data
US 2007/0001179 A1    Jan. 4, 2007

(30) Foreign Application Priority Data

Nov. 29, 2004  (KR) .................... 10-2004-0098825
Dec. 30, 2004  (KR) .................... 10-2004-0116863

(51) Int. Cl.
*H01L 29/24* (2006.01)
(52) U.S. Cl. ................ 257/103; 257/E33.013
(58) Field of Classification Search .......... 257/103
See application file for complete search history.

(56) References Cited

U.S. PATENT DOCUMENTS

| 5,122,845 | A  | 6/1992  | Manabe et al. |
| 5,247,533 | A  | 9/1993  | Okazaki |
| 5,290,393 | A  | 3/1994  | Nakamura |
| 5,306,662 | A  | 4/1994  | Nakamura |
| 5,563,422 | A  | 10/1996 | Nakamura |
| 5,652,434 | A  | 7/1997  | Nakamura |
| 5,733,796 | A  | 3/1998  | Manabe |
| 6,194,743 | B1 | 2/2001  | Kondoh |
| 6,515,306 | B2 | 2/2003  | Kuo |
| 7,014,710 | B2 * | 3/2006 | Fang et al. ............... 117/92 |
| 2004/0101012 | A1 | 5/2004 | Nakamura et al. |

FOREIGN PATENT DOCUMENTS

| KR | 10-043346 | 7/2000 |
| KR | 10-0448352 | 11/2003 |
| WO | WO 02/021121 | 3/2002 |

* cited by examiner

Primary Examiner—B. William Baumeister
Assistant Examiner—Matthew L. Reames
(74) Attorney, Agent, or Firm—Blackwell Sanders Peper Martin LLP

(57) ABSTRACT

The present invention relates to an III-nitride semiconductor light emitting device in which a single layer or plural layers made of $Si_xC_yN_z$ ($x \geq 0$, $y \geq 0$, $x+y>0$, $z>0$) are inserted into or under an active layer and it is directed to a technology in which $Al(x)Ga(y)In(1-x-y)N$ ($0 \leq x \leq 1$, $0 \leq y \leq 1$, $0 \leq x+y \leq 1$) of the hexagonal structure and $Si_xC_yN_z$ ($x \geq 0$, $y \geq 0$, $x+y>0$, $z>0$) of the hexagonal structure are combined together in view of the properties of the $Si_xC_yN_z$ ($x \geq 0$, $y \geq 0$, $x+y>0$, $z>0$) material.

25 Claims, 10 Drawing Sheets

| posi tion | Vf1(V) 20mA | Vf2(V) 10uA | Vf3(V) 5mA | Ir(uA) -5V | Wd(nm) 20mA | Wh(nm) 20mA | Wd3(nm) 5mA | Vr(V) -10uA | POUT 20mA |
|---|---|---|---|---|---|---|---|---|---|
| 1 | 3.09 | 2.55 | 2.88 | 0.01 | 458.9 | 25 | 461.0 | 16.2 | 145.5 |
| 3 | 3.23 | 2.53 | 2.90 | 0.01 | 458.3 | 25 | 461.3 | 17.0 | 154.5 |
| 5 | 3.24 | 2.53 | 2.90 | 0.01 | 456.3 | 24 | 458.2 | 15.8 | 150.0 |
| 7 | 3.09 | 2.52 | 2.86 | 0.01 | 459.6 | 24 | 462.0 | 16.7 | 152.3 |
| 11 | 3.09 | 2.52 | 2.86 | 0.01 | 458.4 | 25 | 461.3 | 16.9 | 152.3 |
| AVE | 3.15 | 2.53 | 2.88 | 0.01 | 458.4 | 24.6 | 414.9 | 16.5 | 150.9 |

● electron
○ hole

| position | Vf1(V) 20mA | Vf2(V) 10uA | Vf3(V) 5mA | Ir(uA) -5V | Wd(nm) 20mA | Wh(nm) 20mA | Wd3(nm) 5mA | Vr(V) -10uA | POUT 20mA |
|---|---|---|---|---|---|---|---|---|---|
| 1 | 3.20 | 2.56 | 2.94 | 0.01 | 466.1 | 28 | 468.7 | 35.3 | 140.0 |
| 3 | 3.20 | 2.56 | 2.94 | 0.00 | 466.3 | 27 | 470.2 | 29.2 | 145.0 |
| 5 | 3.21 | 2.57 | 2.94 | 0.01 | 464.5 | 25 | 468.1 | 34.8 | 144.0 |
| 7 | 3.20 | 2.56 | 2.93 | 0.01 | 467.1 | 27 | 470.8 | 36.0 | 147.0 |
| 11 | 3.22 | 2.56 | 2.94 | 0.01 | 465.6 | 26 | 468.6 | 30.7 | 150.0 |
| AVE | 3.21 | 2.56 | 2.94 | 0.01 | 466.1 | 26.6 | 469.6 | 33.2 | 113.2 |

III-NITRIDE SEMICONDUCTOR LIGHT EMITTING DEVICE

TECHNICAL FIELD

The present invention relates to a III-nitride semiconductor light emitting device, and more particularly, to a III-nitride semiconductor light emitting device in which a single layer or plural layers made of $Si_xC_yN_z$ ($x \geq 0$, $y \geq 0$, $x+y>0$, $z>0$) are inserted into or under a nitride active layer.

As used herein, the term III-nitride compound semiconductor light emitting device refers to a light emitting device, such as a light emitting diode comprising a compound semiconductor layer made of $Al(x)Ga(y)In(1-x-y)N$ ($0 \leq x \leq 1$, $0 \leq y \leq 1$, $0 \leq x+y \leq 1$), and does not exclude the inclusion of either materials made of other group elements, such as SiC, SiN, SiCN, and CN, or a semiconductor layer made of such materials.

BACKGROUND ART

FIG. 1 shows a III-nitride compound semiconductor light emitting device according to the prior art. As shown in FIG. 1, the light emitting device comprises the substrate 100, the buffer layer 200 epitaxially grown on the substrate 100, the n-type nitride semiconductor layer 300 epitaxially grown on the buffer layer 200, the active layer 400 epitaxially grown on the n-type nitride layer 300, the p-type nitride semiconductor layer 500 epitaxially grown on the active layer 400, the p-side electrode 600 formed on the p-type nitride semiconductor layer 500, the p-side bonding pad 700 formed on the p-side electrode 600, and the n-side electrode 800 formed on the n-type nitride semiconductor layer 301 exposed by mesa-etching of at least the p-type nitride semiconductor layer 500 and the active layer 400.

The substrate 100 can use a GaN-based substrate as a homogeneous substrate, and a sapphire substrate, a silicon carbide substrate or a silicon substrate as a heterogeneous substrate, but can use any other substrates on which nitride semiconductor layers can be grown.

The nitride semiconductor layers epitaxially grown on the substrate 100 are usually grown by means of MOCVD (Metal Organic Chemical Vapor Deposition) method.

The buffer layer 200 serves to reduce differences in lattice constant and the coefficient of thermal expansion between the heterogeneous substrate 100 and the nitride semiconductor. U.S. Pat. No. 5,122,845 discloses a technology in which an AlN buffer layer having a thickness of 100 Å to 500 Å is grown on a sapphire substrate at a temperature ranging from 380° C. to 800° C. U.S. Pat. No. 5,290,393 discloses a technology in which an $Al(x)Ga(1-x)N$ ($0 \leq x < 1$) buffer layer having a thickness of 10 Å to 5000 Å is grown on a sapphire substrate at a temperature ranging from 200° C. to 900° C. Korean Patent No. 10-0448352 discloses a technology in which a SiC buffer layer is grown at a temperature ranging from 600° C. to 990° C., and an $In(x)Ga(1-x)N$ ($0<x \leq 1$) layer is grown on the SiC buffer layer.

In the n-type nitride semiconductor layer 300, at least a region (n-type contact layer) in which the n-side electrode 800 is formed is doped with an impurity. The n-type contact layer is preferably made of GaN and is doped with Si. U.S. Pat. No. 5,733,796 discloses a technology in which an n-type contact layer is doped with a desired doping concentration by controlling a mixing ratio of Si and other source materials.

The active layer 400 is a layer for emitting a photon (light) by recombination of electrons and holes, and is mainly made of $In(x)Ga(1-x)N$ ($0<x \leq 1$). The active layer 400 is composed of a single quantum well or multi quantum wells. WO02/021121 discloses a technology in which only some of a plurality of quantum wells and barrier layers are doped.

The p-type nitride semiconductor layer 500 is doped with an impurity such as Mg, and has a p-type conductivity through an activation process. U.S. Pat. No. 5,247,533 discloses a technology in which a p-type nitride semiconductor layer is activated by means of irradiation of electron beam. U.S. Pat. No. 5,306,662 discloses a technology in which a p-type nitride semiconductor layer is activated through annealing at a temperature of 400° C. or more. Korean Patent No. 10-043346 discloses a technology in which $NH_3$ and a hydrazine-based source material are used together as a nitrogen precursor for growing a p-type nitride semiconductor layer, so that the p-type nitride semiconductor layer has a p-type conductivity without an activation process.

The p-side electrode 600 serves to allow the current to be supplied to the entire p-type nitride semiconductor layer 500. U.S. Pat. No. 5,563,422 discloses a technology of a light-transmitting electrode, which is formed almost on the entire p-type nitride semiconductor layer, in ohmic contact with the p-type nitride semiconductor layer, and made of Ni and Au. U.S. Pat. No. 6,515,306 discloses a technology of a light-transmitting electrode made of ITO(Indium Tin Oxide), which is formed on the n-type superlattice layer formed on the p-type nitride semiconductor layer.

Meanwhile, the p-side electrode 600 can be formed to have such a thick thickness that the p-side electrode 600 does not transmit light, i.e., the p-side electrode 600 reflects light toward the substrate. A light emitting device using this p-side electrode 600 is called a flip chip. U.S. Pat. No. 6,194,743 discloses a technology of an electrode structure including an Ag layer of 20 nm or more in thickness, a diffusion barrier layer covering the Ag layer, and a bonding layer made of Au and Al, which covers the diffusion barrier layer.

P-side bonding pad 700 and n-side electrode 800 are for providing current into the device and for wire-bonding out of the device. U.S. Pat. No. 5,563,422 discloses a technology of an n-side electrode made of Ti and Al. U.S. Pat. No. 5,652,434 discloses a technology of p-side bonding pad directly contacted with p-type nitride semiconductor layer by partially removing the light-transmitting electrode.

In a light emitting device, the most integral element is an active layer. Electrons and holes respectively formed in an n-side and a p-side are combined with each other together in a quantum-well layer of the active layer so as to emit light corresponding to the energy band of a quantum-well layer material. Therefore, the efficiency of the light emitting device is greatly influenced by the crystal quality of the active layer, particularly, a quantum-well layer, strain given to the quantum-well layer, the shape of the quantum-well layer and the like. Major parameters of the electrical and optical properties of the light emitting device are also largely dependent upon the above-mentioned factors.

III-nitride semiconductor light emitting devices usually employ heterogeneous substrates such as a sapphire substrate, a silicon carbide substrate or a silicon substrate. Inherently, lots of crystal defects are thus generated in a grown thin film. It is generally known that dislocations of $10^8$ $cm^2$ or more exist.

It is evident that these dislocations reduce the efficiency of the III-nitride semiconductor light emitting devices. However, the reason why the III-nitride semiconductor light emitting devices can show stabilized performance of some degrees even in spite of lots of dislocations is that the active layer has both characteristics of the quantum well and the quantum dot. Accordingly, in order to improve the performance of the light emitting device, especially, brightness, it is necessary to strengthen formation of this quantum dot. It is, however, not easy to strengthen the formation of this quantum dot only with existing thin film growth technology.

Further, strain formed in the active layer serves as an important factor having an influence on the properties of the active layer. A variety of differences occur between the photoluminescence (PL) characteristic and the electroluminescence (EL) characteristic of the light emitting device according to the strain. In this connection, the control of strain around the active layer or in the active layer itself becomes an important factor in order to improve the efficiency of the light emitting device.

DISCLOSURE

Technical Problem

Accordingly, the present invention has been made in view of the above problems occurring in the prior art, and it is an object of the present invention to provide a III-nitride semiconductor light emitting device in which a single layer or plural layers made of $Si_xC_yN_z(x \geq 0, y \geq 0, x+y>0, z>0)$ are inserted into or under an active layer to control strain applied to the active layer, and an active layer having an enhanced three-dimensional shape (quasi quantum dots active layer) is formed.

Technical Solution

To achieve the above object, according to the present invention, there is provided an III-nitride semiconductor light emitting device in which a single layer or plural layers made of $Si_xC_yN_z(x \geq 0, y \geq 0, x+y>0, z>0)$ are inserted into or under an active layer.

The $Si_xC_yN_z(x \geq 0, y \geq 0, x+y>0, z>0)$ material is a direct band gap material. It is known that the energy band gap of the material can vary in a wide range depending upon the composition, and the material can have a cubic structure or hexagonal structure depending upon a growth condition. The present invention has been made in view of these properties of the $Si_xC_yN_z(x \geq 0, y \geq 0, x+y>0, z>0)$ material, and it is directed to a technology in which $Al(x)Ga(y)In(1-x-y)N(0 \leq x \leq 1, 0 \leq y \leq 1, 0 \leq x+y \leq 1)$ of the hexagonal structure and $Si_xC_yN_z(x \geq 0, y \geq 0, x+y>0, z>0)$ of the hexagonal structure are combined together.

According to a first aspect of the present invention, there is provided a III-nitride semiconductor light emitting device including a substrate, and a plurality of nitride semiconductor layers, which are grown on the substrate and have an active layer for generating photons through recombination of electrons and holes, wherein the active layer includes a light emitting layer that generates photons through recombination of electrons and holes, and a barrier layer, which is grown on the light emitting layer and confines the electrons and holes to the light emitting layer, and the light emitting layer includes a $Si_xC_yN_z(x \geq 0, y \geq 0, x+y>0, z>0)$ layer, and a nitride semiconductor layer, which is grown on the $Si_xC_yN_z(x \geq 0, y \geq 0, x+y>0, z>0)$ layer and includes Ga and N. The first aspect of the present invention is supported by a third embodiment of the present invention.

Conventionally, in a III-nitride semiconductor light emitting device, the term "active layer" refers to a region from which light is substantially emitted. The region includes a quantum-well layer made of $Al(x)Ga(y)In(1-x-y)N$ $(0 \leq x \leq 1, 0 \leq y \leq 1, 0 \leq x+y \leq 1)$, which is a light emitting layer that emits photons through recombination of electrons and holes, and a barrier layer made of a single layer or plural layers of $Al(x)Ga(y)In(1-x-y)N(0 \leq x \leq 1, 0 \leq y \leq 1, 0 \leq x+y \leq 1)$, which has an average energy band gap higher than that of the quantum-well layer. The active layer includes at least one quantum-well layer. If the active layer is composed of the multi-quantum-well layers, it is not necessary that all of the quantum-well layers have the same composition or energy band gap, and thickness. The barrier layer is a layer that is adjacent to the quantum-well layer, and refers to a layer that can confine electrons or holes to the quantum-well layer.

The present invention includes the $Si_xC_yN_z(x \geq 0, y \geq 0, x+y>0, z>0)$ layer within the active layer region, and thus presents a new type of an active layer. That is, the light emitting layer, which was composed of only the $Al(x)Ga(y)In(1-x-y)N(0 \leq x \leq 1, 0 \leq y \leq 1, 0 \leq x+y \leq 1)$ layer in the prior art, is replaced with the stack structure of the $Si_xC_yN_z(x \geq 0, y \geq 0, x+y>0, 0)$ layer and the nitride semiconductor layer, which is grown on the $Si_xC_yN_z(x \geq 0, y \geq 0, x+y>0, z>0)$ layer and includes Ga and N. The existence of the $Si_xC_yN_z$ $(x \geq 0, y \geq 0, x+y>0, z>0)$ layer affects the growth of the nitride semiconductor layer including Ga and N. Due to this, the light emitting layer has a shape having an enhanced three-dimensional characteristic or a shape having three-dimensional islands (called "Quasi Quantum Dots") not a simple two-dimensional quantum well structure. In the present invention, the active layer including a new type of the light emitting layer having an three-dimensional characteristic improved unlike the prior art is called a quasi quantum dots active layer.

According to a second aspect of the present invention, there is provided a III-nitride semiconductor light emitting device including a substrate, and a plurality of nitride semiconductor layers, which are grown on the substrate and have an active layer having one or more light emitting layers that emits light through recombination of electrons and holes, including a $Si_xC_yN_z(x \geq 0, y \geq 0, x+y>0, z>0)$ layer, which is located under a light emitting layer located at the farthest from the substrate among one or more light emitting layers and is not brought into contact with the substrate. The second aspect of the present invention is supported by first and second embodiments of the present invention.

In this case, the at least one light emitting layer may have a conventional quantum-well layer or a light emitting layer whose three-dimensional characteristic is strengthened.

Advantageous Effects

According to the present invention, a $Si_xC_yN_z(x \geq 0, y \geq 0, x+y>0, z>0)$ layer is inserted under or into an active layer, thus strengthening a three-dimensional growth characteristic of the active layer. Accordingly, a III-nitride semiconductor light emitting device having improved optical and electrical characteristics can be provided.

DESCRIPTION OF DRAWINGS

Further objects and advantages of the invention can be more fully understood from the following detailed description taken in conjunction with the accompanying drawings in which.

MODE FOR INVENTION

The present invention will now be described in detail in connection with preferred embodiments with reference to the accompanying drawings.

A method of growing a $Si_xC_yN_z(x\geq 0, y\geq 0, x+y>0, z>0)$ layer on a GaN layer will be first described. A III-nitride semiconductor light emitting device in which the $Si_xC_yN_z(x\geq 0, y\geq 0, x+y>0, z>0)$ layer is inserted into an active layer or under the active layer will be then described in connection with embodiments.

A GaN layer is grown on a sapphire substrate, and a $Si_xC_yN_z(x\geq 0, y\geq 0, x+y>0, z>0)$ layer is grown on the grown GaN layer according to a common method. Characteristics of the grown $Si_xC_yN_z(x\geq 0, y\geq 0, x+y>0, z>0)$ layer are analyzed through an AFM.

In order to form the $Si_xC_yN_z(x\geq 0, y\geq 0, x+y>0, z>0)$ layer, DTBSi being a kind of a metal organic source was used as a silicon supply source, $CBr_4$ being a kind of a metal organic source was use as a carbon supply source, and $NH_3$ or DMHy was used as a nitrogen supply source. The reason why these sources were used is that they are easily thermally decomposed at low temperature, and are thus advantageous in forming the $Si_xC_yN_z(x\geq 0, y\geq 0, x+y>0, z>0)$ layer at low temperature compared to hydride source such as existing $CH_4$, the $SiH_4$, and the like. In the present invention, however, it is to be noted that the sources for forming the $Si_xC_yN_z(x\geq 0, y\geq 0, x+y>0, z>0)$ layer are not limited to DTBsi, $CBr_4$, $NH_3$ or DMHy, but the $SiH_4$, the $Si_2H_6$, etc. can be used as the silicon source, and $CCl_4$, $CH_4$, etc. can be also used as the carbon source.

If the $Si_xC_yN_z(x\geq 0, y\geq 0, x+y>0, z>0)$ layer is formed on an $Al(x)Ga(y)In(1-x-y)N(0\leq x\leq 1, 0\leq y\leq 1, 0\leq 0\leq x+y\leq 1)$ layer, $NH_3$, a hydrazine-based source or $NH_3$ and a hydrazine-based source can be used as a nitrogen supplier. Thus, there is an advantage in that it can prevent metal conglomeration in the $Al(x)Ga(y)In(1-x-y)N(0\leq x\leq 1, 0\leq y\leq 1, 0\leq x+y\leq 1)$ layer under the $Si_xC_yN_z(x\geq 0, y\geq 0, x+y>0, z>0)$ layer due to the shortage of a nitrogen radical supply while a thin film is grown. In other words, it is possible to grow a desired $Si_xC_yN_z(x\geq 0, y\geq 0, x+y>0, z>0)$ layer while not damaging an underlying semiconductor layer while the $Si_xC_yN_z(x\geq 0, y\geq 0, x+y>0, z>0)$ layer is grown.

Figure 1:
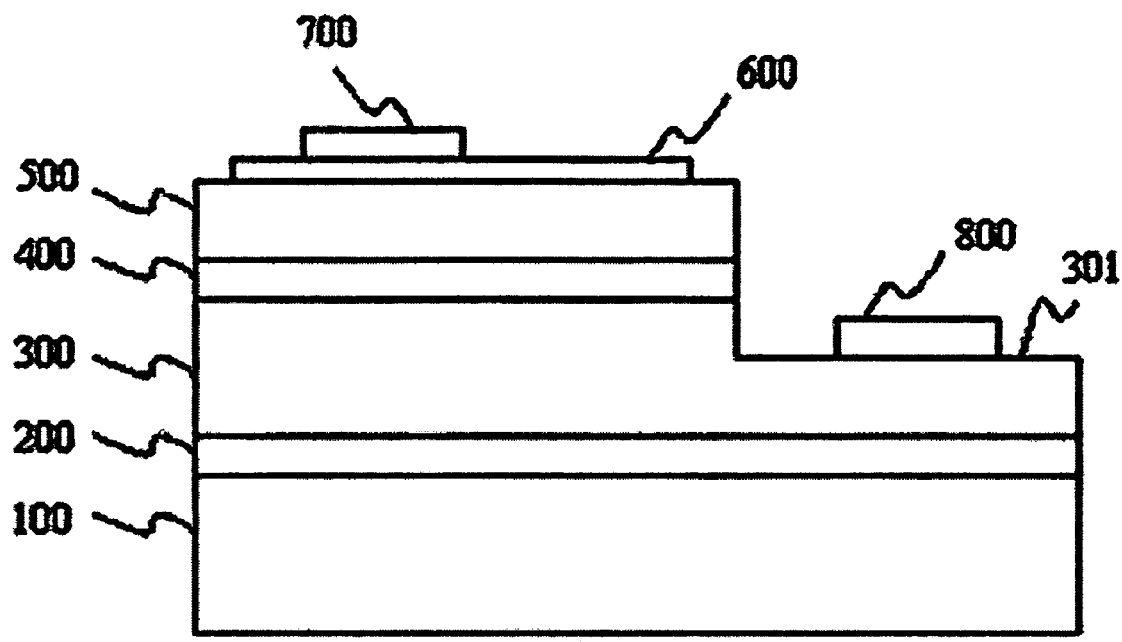
FIG. 1 shows the structure of a III-nitride semiconductor light emitting device in the prior art.
Figure 2:
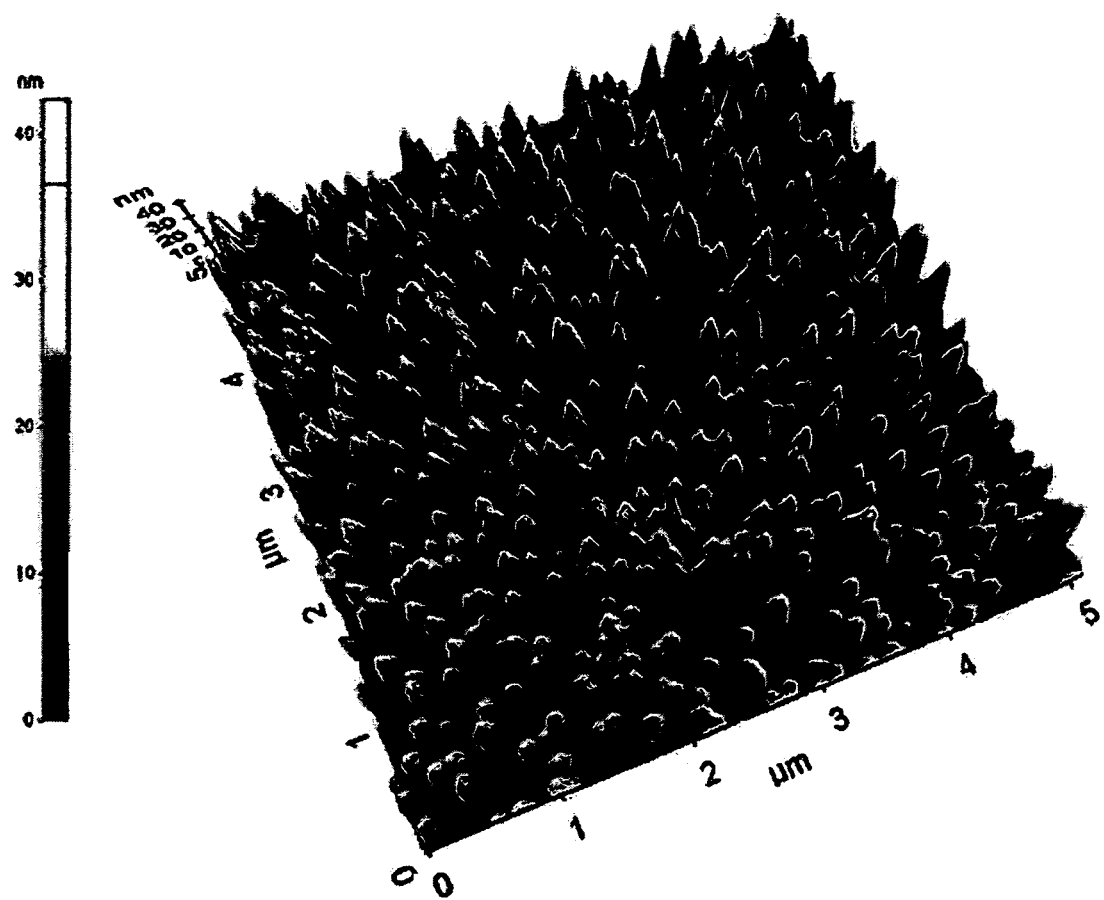
FIG. 2 shows an atomic force microscope (AFM) image of a CN layer, which is grown about 20 nm in thickness on a GaN layer.

FIG. 2 shows an AFM image of a CN layer, which is grown about 20 nm in thickness on a GaN layer. From FIG. 2, it can be seen that the CN layer is grown on the GaN layer like three-dimensional islands. Since the lattice constant of CN is significantly lower than that of GaN, the CN layer is grown as the island shape due to strain. Island growth means that the grown CN layer has a crystal shape.

Figure 3:
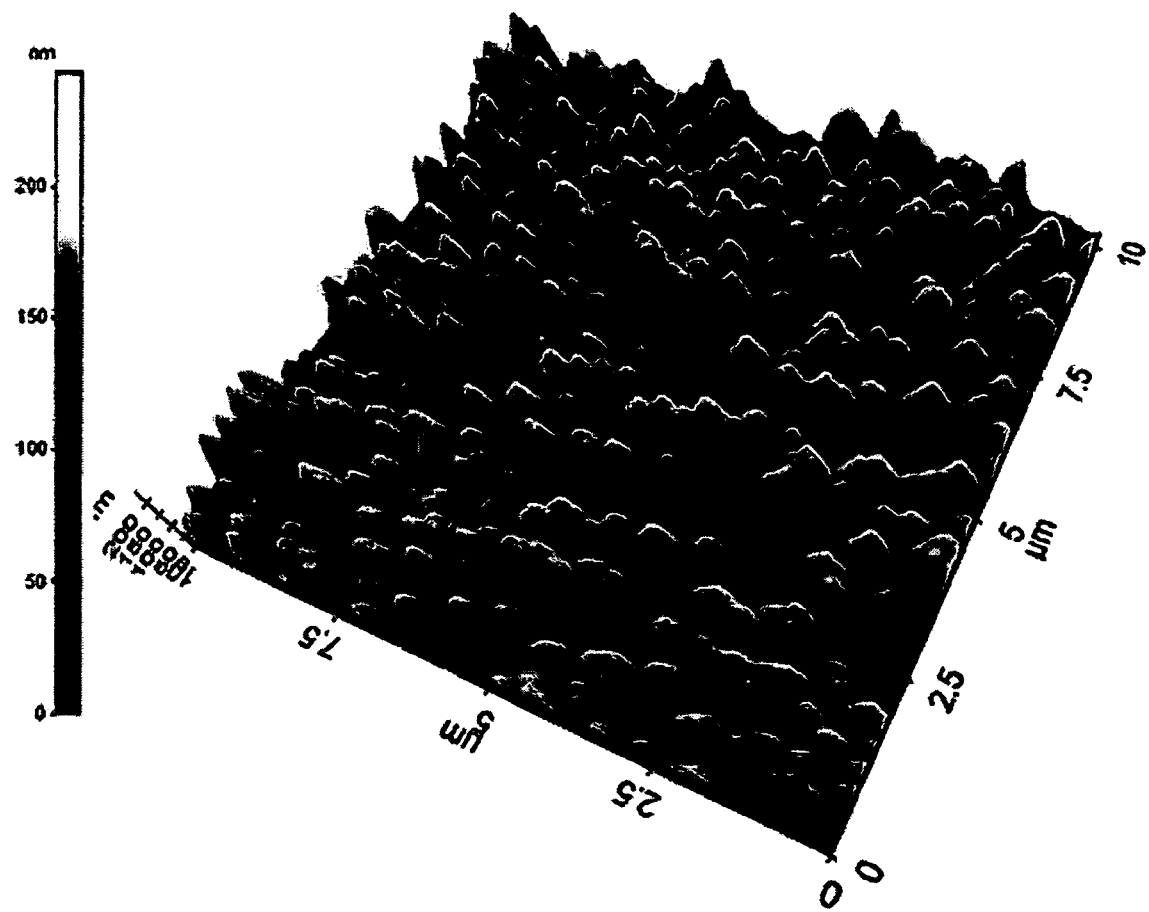
FIG. 3 shows an AFM image when the CN layer of FIG. 2 is thickly grown to a thickness more than 100 nm.

FIG. 3 shows an AFM image when the CN layer of FIG. 2 is thickly grown to a thickness more than 100 nm. From FIG. 3, it can be seen that the size of the islands made of CN is increased. That is, the islands made of CN, which are initially grown, serve as seeds, and are thus continuously grown around the seeds.

Figure 4:
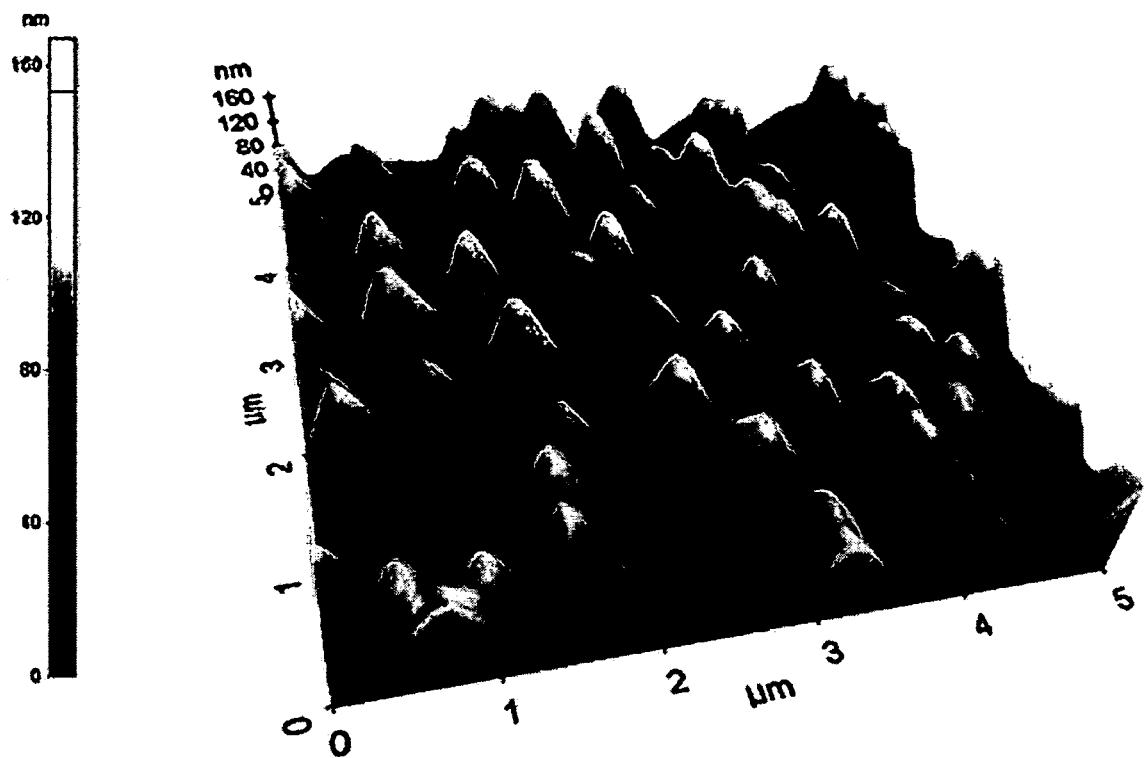
FIG. 4 shows an AFM image of a $Si_xC_yN_z(x>0, y>0, z>0)$ layer grown on a GaN layer.

FIG. 4 shows an AFM image of the $Si_xC_yN_z(x>0, y>0, z>0)$ layer grown on the GaN layer. $Si_xC_yN_z(x>0, y>0, z>0)$ has a lattice constant higher than that of CN, and has a similar lattice constant as that of GaN. Thus, $Si_xC_yN_z(x>0, y>0, z>0)$ shows a continuous thin film shape compared to CN, and has a shape that rises high like a summit due to strain.

In this experiment, $NH_3$ was used as the nitrogen source, $CBr_4$ was used as the carbon source, and DTBSi was used as the silicon source. After the $Si_xC_yN_z(x>0, y>0, z>0)$ layer was grown around 950° C., a temperature of a reactor dropped to below 100° C. under a hydrogen atmosphere.

In the experiments of FIGS. 2 to 4, in order to confirm how CN or the $Si_xC_yN_z(x>0, y>0, z>0)$ layer is formed on the GaN layer, it is thickly formed intentionally. It can be seen from FIGS. 2 to 4 that the $Si_xC_yN_z(x\geq 0, y\geq 0, x+y>0, z>0)$ layer intended by the present invention can be grown while not externally affecting the underlying GaN layer. If the nitrogen radical is not sufficient or the GaN layer is damaged due to other reasons while the $Si_xC_yN_z(x\geq 0, y\geq 0, x+y>0, z>0)$ layer is grown, there occurs a phenomenon that the surface of a thin film is conglomerated or becomes coarse. From FIGS. 2 to 4, it can be seen that the surface of the GaN layer under the $Si_xC_yN_z(x\geq 0, y\geq 0, x+y>0, z>0)$ layer is smooth. Accordingly, it can be seen that the growth of the $Si_xC_yN_z(x\geq 0, y\geq 0, x+y>0, z>0)$ layer can be implemented through a combination with the growth of the $Al(x)Ga(y)In(1-x-y)N$ $(0\leq x\leq 1, 0\leq y\leq 1, 0\leq x+y\leq 1)$ layer.

Various combinations of the $Si_xC_yN_z(x\geq 0, y\geq 0, x+y>0, z>0)$ layer and the active layer and the effects of the combinations will now be described in connection with embodiments.

FIRST EMBODIMENT

Figure 5:
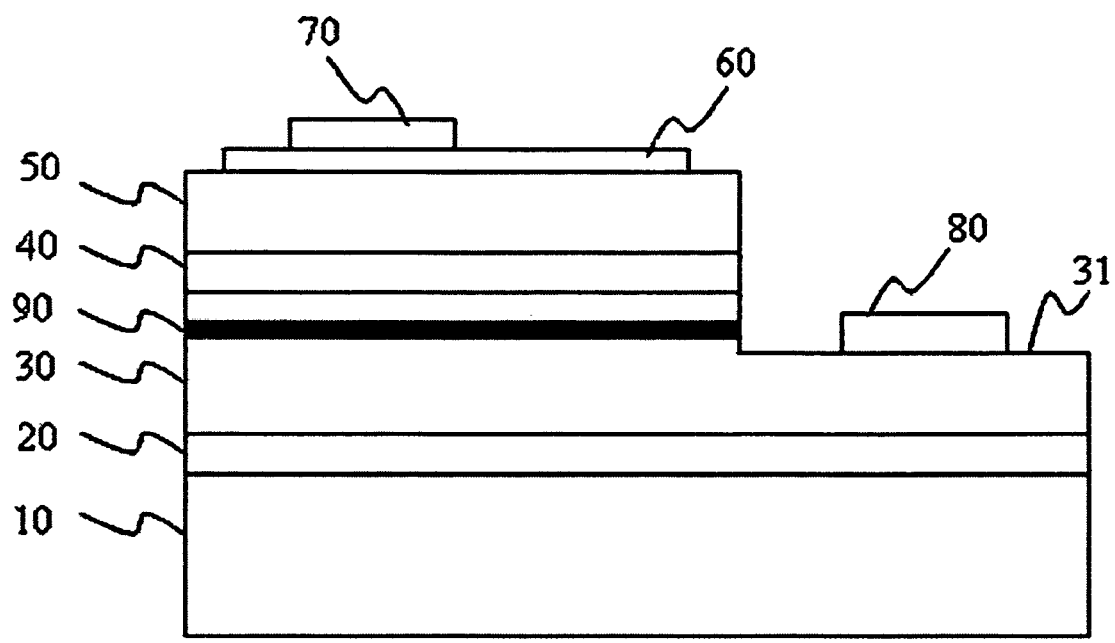
FIG. 5 is a cross-sectional view of a III-nitride semiconductor light emitting device according to a first embodiment of the present invention.

FIG. 5 is a cross-sectional view of a III-nitride semiconductor light emitting device according to a first embodiment of the present invention.

The light emitting device includes a substrate 10, a buffer layer 20 epitaxially grown on the substrate 10, an n-type nitride semiconductor layer 30 epitaxially grown on the buffer layer 20, an active layer 40 epitaxially grown on the n-type nitride semiconductor layer 30, a p-type nitride semiconductor layer 50 epitaxially grown on the active layer 40, a p-side electrode 60 formed on the p-type nitride semiconductor layer 50, a p-side bonding pad 70 formed on the p-side electrode 60, and a n-side electrode 80 formed on an n-type nitride semiconductor layer 31, which is exposed through mesa-etching of at least the p-type nitride semiconductor layer 50 and the active layer 40. A $Si_xC_yN_z$ ($x \geq 0$, $y \geq 0$, $x+y>0$, $z>0$) layer 90 is formed between the active layer 40 and the n-type nitride semiconductor layer 30.

The n-type nitride semiconductor layer 30 and the p-type nitride semiconductor layer 50 are composed of $Al(x)Ga(y)In(1-x-y)N$ ($0 \leq x \leq 1$, $0 \leq y \leq 1$, $0 \leq x+y \leq 1$), and can be respectively composed of a single or plural layers.

In order to have an effect on the growth of the active layer 40, it is preferred that the location where the $Si_xC_yN_z$ ($x \geq 0$, $y \geq 0$, $x+y>0$, $z>0$) layer 90 is located is immediately under the active layer 40, or within a range of 0.5 μm from the active layer 40. In this case, the lowest layer of the active layer 40 can be a barrier layer or a light emitting layer. The closer the $Si_xC_yN_z$ ($x \geq 0$, $y \geq 0$, $x+y>0$, $z>0$) layer toward the active layer 40, the greater the effect by the $Si_xC_yN_z$ ($x \geq 0$, $y \geq 0$, $x+y>0$, $z>0$) layer 90. The $Si_xC_yN_z$ ($x \geq 0$, $y \geq 0$, $x+y>0$, $z>0$) layer can be located 0.5 μm apart from the active layer 40. In this case, however, desired effects cannot be expected.

A thickness of the $Si_xC_yN_z$ ($x \geq 0$, $y \geq 0$, $x+y>0$, $z>0$) layer 90 preferably ranges from 2.5 Å to 500 Å. The thicker the $Si_xC_yN_z$ ($x \geq 0$, $y \geq 0$, $x+y>0$, $z>0$) layer 90, the greater the influence on variation in morphology of a layer formed thereon. However, if the thickness of the $Si_xC_yN_z$ ($x \geq 0$, $y \geq 0$, $x+y>0$, $z>0$) layer 90 is over 500 Å, the layer grown thereon is excessively grown in three dimensions. In this case, it may be difficult to be applied to the light emitting device. If the thickness is below 2.5 Å, the effect on the layer grown thereon us too small.

Regarding the material composition of $Si_xC_yN_z$ ($x \geq 0$, $y \geq 0$, $x+y>0$, $z>0$), in order to protect the underlying $Al(x)Ga(y)In(1-x-y)N$ ($0 \leq x \leq 1$, $0 \leq y \leq 1$, $0 \leq x+y \leq 1$) layer 30, $NH_3$ or the hydrazine-based source must be injected in a continuous manner. Thus, N (value of z) must be over 0, and Si or C can be excluded, if needed. The composition can be decided according to desired strain. The higher x and the lower C (value of y), the greater the lattice of $Si_xC_yN_z$. On the contrary, the lower x and the higher C (value of y), the smaller the lattice of $Si_xC_yN_z$.

It is preferred that the growth temperature of the $Si_xC_yN_z$ ($x \geq 0$, $y \geq 0$, $x+y>0$, $z>0$) layer 90 ranges from 400° C. to 1100° C. $Si_xC_yN_z$ ($x \geq 0$, $y \geq 0$, $x+y>0$, $z>0$) can be grown with better quality at higher temperature. If $Si_xC_yN_z$ ($x \geq 0$, $y \geq 0$, $x+y>z>0$) is grown at a temperature higher than that of $Al(x)Ga(y)In(1-x-y)N$ ($0 \leq x \leq 1$, $0 \leq y \leq 1$, $0 \leq x+y \leq 1$), however, the underlying $Al(x)Ga(y)In(1-x-y)N$ ($0 \leq x \leq 1$, $0 \leq y \leq 1$, $0 \leq x+y \leq 1$) layer 30 can be damaged.

Figure 6:
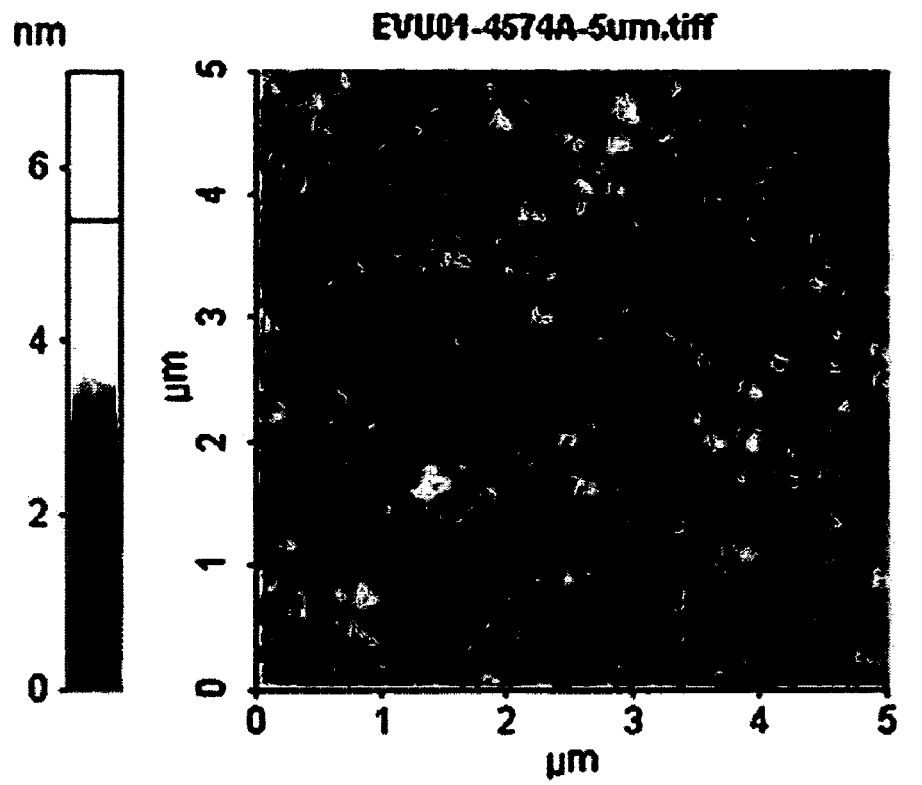
FIG. 6 shows an AFM image of an active layer that is grown after a $Si_xC_yN_z(x\geq 0, y\geq 0, x+y>0, z>0)$ layer is inserted under an active layer according to the first embodiment.
Figure 6:
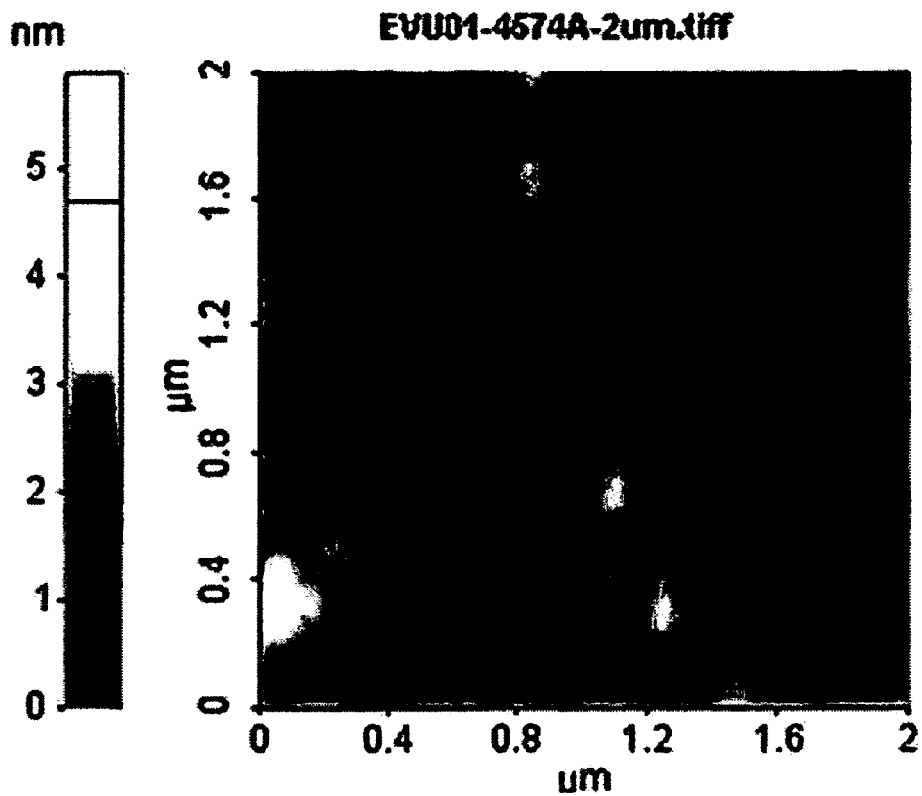

FIG. 6 shows an AFM image of an active layer that is grown after the $Si_xC_yN_z$ ($x \geq 0$, $y \geq 0$, $x+y>0$, $z>0$) layer 90 is inserted under the active layer 40 according to the first embodiment.

At this time, the source for growing the $Si_xC_yN_z$ ($x \geq 0$, $y \geq 0$, $x+y>0$, $z>0$) layer 90 was DTBSi of 3 micro mole per minute, $CBr_4$ of 7 micro mole per minute, and $NH_3$ of 8 liters per minute. A growth time was 20 seconds, a growth temperature is approximately 1000° C., and an expected growth thickness was 5 to 10 Å. A first light emitting layer was grown on the $Si_xC_yN_z$ ($x \geq 0$, $y \geq 0$, $x+y>0$, $z>0$) layer 90.

Figure 7:
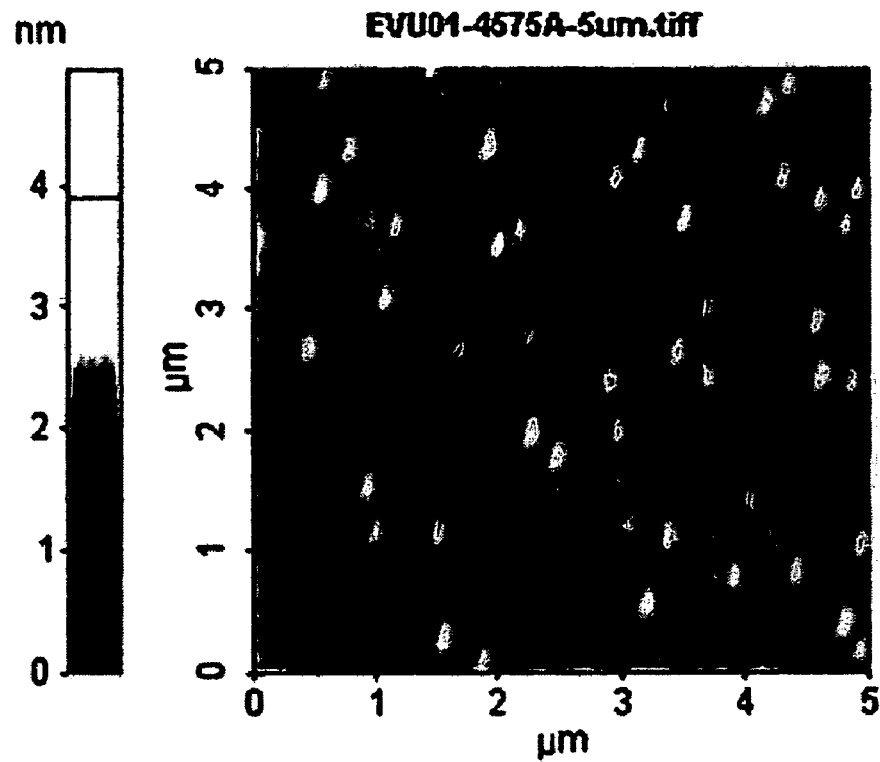
FIG. 7 shows an AFM image of an active layer grown without the $Si_xC_yN_z(x\geq 0, y\geq 0, x+y>0, z>0)$ layer.
Figure 7:
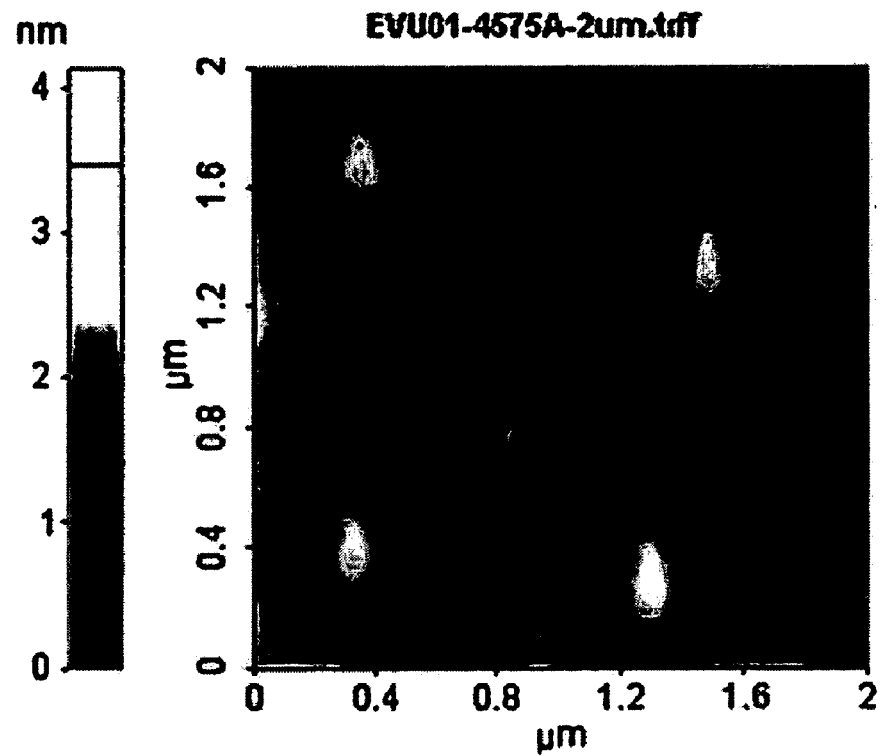

FIG. 7 shows an AFM image of the active layer 40 that was grown under the same condition without the $Si_xC_yN_z$ ($x \geq 0$, $y \geq 0$, $x+y>0$, $z>0$) layer 90. From FIG. 7, it can be seen that the active layer looks like a ridgeline, and the ridgelines are connected to each other laterally. As shown in an enlarged image on the underside, the surface has grains and has a bad uniformity irregularly. Further, white points can be shown from the drawing. They indicate portions that rise high, wherein indium metals are conglomerated. It has been known that such indium metal conglomeration phenomenon has a bad influence on the reliability and performance of a device.

Meanwhile, as shown in FIG. 6, in the active layer 40 into which the $Si_xC_yN_z$ ($x \geq 0$, $y \geq 0$, $x+y>0$, $z>0$) layer 90 is inserted, the active layer does not have grain shape, but has an almost independent island shape.

It can be seen that the islands are formed relatively in a very regular manner. In the enlarged image on the underside, the islands can be seen well. This is because the three-dimensional growth of the active layer is strengthen due to variation in strain of the active layer by the $Si_xC_yN_z$ ($x \geq 0$, $y \geq 0$, $x+y>0$, $z>0$) layer 90, as described above. It can be seen that the islands have the size of approximately 0.1 μm to 0.2 μm. It will be, however, evident to those skilled in the art that the size, density and shape of the islands can be changed in various manners depending upon the composition of the $Si_xC_yN_z$ ($x \geq 0$, $y \geq 0$, $x+y>0$, $z>0$) layer 90.

In the event that the active layer 40 is composed of uniform three-dimensional islands, an electron and hole confinement phenomenon can be improved, the uniformity within the active layer 40 can be improved, and optical properties can be improved accordingly. Furthermore, the indium metal conglomeration phenomenon that was shown in FIG. 7 can be significantly improved.

A light emitting device according to the first embodiment of the present invention and a light emitting device without the $Si_xC_yN_z$ ($x \geq 0$, $y \geq 0$, $x+y>0$, $z>0$) layer 90 showed significant difference in a measured wavelength on photoluminescence (PL). In the case of the light emitting device into which the $Si_xC_yN_z$ ($x \geq 0$, $y \geq 0$, $x+y>0$, $z>0$) layer 90 is inserted, it was found that the measured wavelength on PL reduced about 10 nm. It is considered that this is caused by two reasons.

Firstly, quantum dots showed a phenomenon that the wavelength shortens while the energy levels of a conduction band and a valence band more widen than that of the quantum well. As shown in the AFM image of FIG. 6, it can be understood that the wavelength of the active layer shortens while three-dimensional characteristic thereof is enhanced (while having quasi quantum dot characteristic) due to the $Si_xC_yN_z$ ($x \geq 0$, $y \geq 0$, $x+y>0$, $z>0$) layer 90.

Secondly, it can be understood that this is caused by variation in piezo characteristic due to variation in strain of the active layer 40 by the $Si_xC_yN_z$ ($x \geq 0$, $y \geq 0$, $x+y>0$, $z>0$) layer 90. If the piezo characteristic varies, the wavelength can be changed as the bending degree of the energy band is changed.

Figures 8, 9:
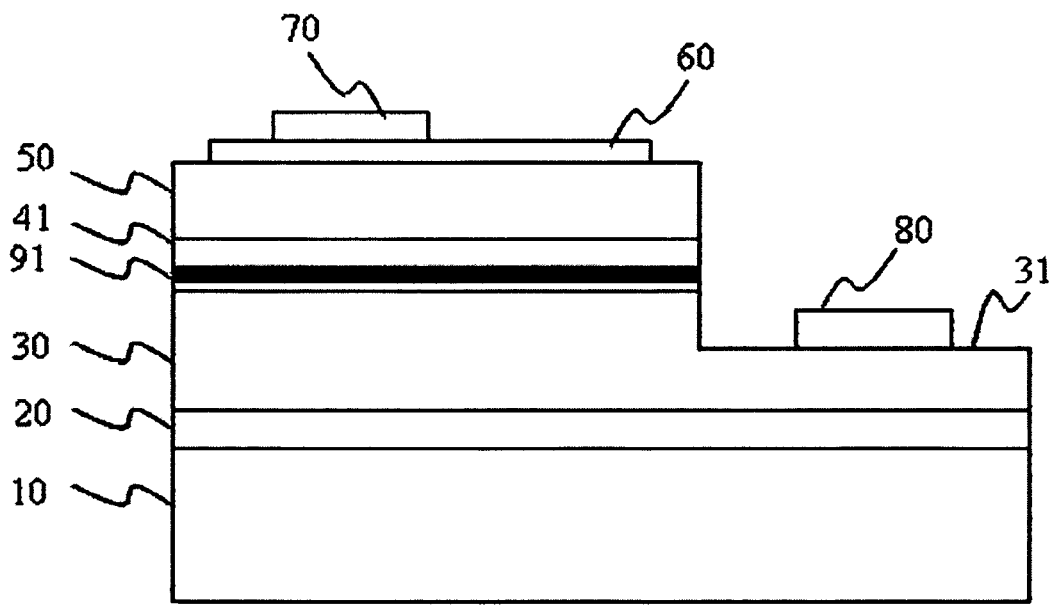
FIG. 8 is a table showing the electrical and optical properties of the III-nitride semiconductor light emitting device according to the first embodiment of the present invention.
FIG. 9 is a cross-sectional view of a III-nitride semiconductor light emitting device according to a second embodiment of the present invention.

FIG. 8 is a table showing the electrical and optical properties of the III-nitride semiconductor light emitting device according to the first embodiment of the present invention. In view of characteristics of the III-nitride semiconductor light emitting device, if the growth condition of an inserted $Si_xC_yN_z$ ($x \geq 0$, $y \geq 0$, $x+y>0$, $z>0$) layer is optimized and the growth condition of the active layer is optimized accordingly, further improved characteristics can be obtained.

The detailed growth condition applied in FIGS. 6 to 8 is as follows. MOCVD method was used using a C face of a sapphire substrate as a main face. $H_2$ and/or $N_2$ were used as carrier gases. The pressure of a reactor while growing a III-nitride semiconductor was maintained between 100 Torr to 500 Torr.

A GaN layer as a buffer layer was first grown on the sapphire substrate at a temperature of 550° C., and was then grown at a temperature of 1050° C. When the GaN layer was grown at the temperature of 550° C., TMG (50 sccm) and NH$_3$ (15000 sccm) were used as sources. At this time, the GaN layer was grown 300 Å in thickness. On the other hand, when the GaN layer was grown at the temperature of 1050° C., TMG (250 sccm) and NH$_3$ (18000 sccm) were used as the source. At this time, the GaN layer was grown to a thickness of 2 μm.

An n-type GaN layer was then grown as an n-type nitride semiconductor layer at a temperature of 1050° C. In this case, TMG (250 sccm) and NH$_3$ (18000 sccm) were used as sources, and the n-type GaN layer was grown 2 μm in thickness. SiH$_4$ (8 sccm) was used as an n-type dopant.

Next, a $Si_xC_yN_z(x \geq 0, y \geq 0, x+y>0, z>0)$ layer was grown at a temperature of 1000° C. At this time, DTBSi (3 micro-mole/min) and CBr$_4$ (7 micro-mole/min) and NH$_3$ (8 l/min) were used as the sources, and the $Si_xC_yN_z(x \geq 0, y \geq 0, x+y>0, z>0)$ layer was grown for 20 seconds.

An $In_{0.15}Ga_{0.85}N$ layer was then grown as a light emitting layer at a temperature of 800° C. At this time, TMIn (400 sccm), TMG (30 sccm), and NH$_3$ (28000 sccm) were used as the sources, and the $In_{0.15}Ga_{0.85}N$ layer was grown 25 Å in thickness.

Thereafter, an $In_{0.01}Ga_{0.99}N$ layer was grown as a barrier layer at a temperature of 900° C. At this time, TMIn (20 sccm), TMG (30 sccm), and NH$_3$ (28000 sccm) were used as the sources, and the $In_{0.01}Ga_{0.99}N$ layer was grown 100 Å in thickness.

The light emitting layer and the barrier layer were then respectively grown three times in an alternate manner under the same growth condition as above.

Finally, a p-type GaN layer was grown as a p-type nitride semiconductor layer at a temperature of 1000° C. At this time, TMG (100 sccm) and NH$_3$ (18000 sccm) were used as the sources, and the p-type GaN layer was grown 2000 Å in thickness. CP$_2$Mg (500 sccm) was used as a p type dopant.

SECOND EMBODIMENT

FIG. 9 is a cross-sectional view of a III-nitride semiconductor light emitting device according to a second embodiment of the present invention. The light emitting device includes a substrate 10, a buffer layer 20 epitaxially grown on the substrate 10, an n-type nitride semiconductor layer 30 epitaxially grown on the buffer layer 20, an active layer 41, which is epitaxially grown on the n-type nitride semiconductor layer 30 and a plurality of light emitting layers, a p-type nitride semiconductor layer 50 epitaxially grown on the active layer 41, a p-side electrode 60 formed on the p-type nitride semiconductor layer 50, a p-side bonding pad 70 formed on the p-side electrode 60, and a n-side electrode 80 formed on an n-type nitride semiconductor layer 31, which is exposed through mesa-etching of at least the p-type nitride semiconductor layer 50 and the active layer 40, wherein a $Si_xC_yN_z(x \geq 0, y \geq 0, x+y>0, z>0)$ layer 90 is formed within the active layer 41.

Figures 10, 11:
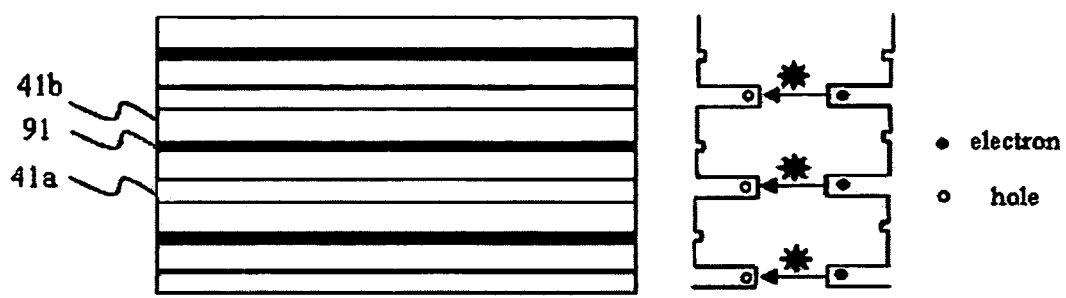
FIG. 10 is an expanded view of the active layer according to the second embodiment of the present invention.
FIG. 11 is a table showing the electrical and optical properties of the III-nitride semiconductor light emitting device according to the second embodiment of the present invention.

FIG. 10 is an expanded view of the active layer 41 according to the second embodiment of the present invention. The $Si_xC_yN_z(x \geq 0, y \geq 0, x+y>0, z>0)$ layer 91 is inserted into a barrier layer 41b, which forms the active layer 41 together with a light emitting layers 41a.

A location where the $Si_xC_yN_z(x \geq 0, y \geq 0, x+y>0, z>0)$ layer 91 is inserted within the barrier layer 41a can be any place. If the $Si_xC_yN_z(x \geq 0, y \geq 0, x+y>0, z>0)$ layer 91 is located at the end or start portion of the barrier layer 41b, however, the light emitting layer 41a and the $Si_xC_yN_z(x \geq 0, y \geq 0, x+y>0, z>0)$ layer 91 are brought into contact with each other. In this case, there is a possibility that the performance of the light emitting device may be degraded. This is caused by the memory effect of sources used when the $Si_xC_yN_z(x \geq 0, y \geq 0, x+y>0, z>0)$ layer 91 is grown or the diffusion effect within the light emitting device. The silicon source serves as an n-type dopant in the nitride semiconductor layer. In this case, there is a possibility that the performance of a device may be degraded due to doping of the light emitting layer.

If there is a sufficient purge time after the $Si_xC_yN_z(x \geq 0, y \geq 0, x+y>0, z>0)$ layer 91 is grown, this phenomena can be minimized. Further, in the case where the $Si_xC_yN_z(x \geq 0, y \geq 0, x+y>0, z>0)$ layer 91 is brought into contact with the light emitting layer 41a of the active layer 41, this problem can be solved by minimizing the used amount of the silicon source. If the active layer 41 is formed using two or more multi-barrier layers, it is not necessary to insert the $Si_xC_yN_z(x \geq 0, y \geq 0, x+y>0, z>0)$ layer 91 into all the barrier layers. In order to maximize the optical characteristic, it is better not to use the $Si_xC_yN_z(x \geq 0, y \geq 0, x+y>0, z>0)$ layer 91 in the barrier layer, which is located at the first place or the first and second places from the p-type nitride semiconductor layer 50. This is because the impurity concentration of the light emitting layer can be increased due to the memory effect of the sources used when the $Si_xC_yN_z(x \geq 0, y \geq 0, x+y>0, z>0)$ layer 91 is grown, as described above.

A thickness of the $Si_xC_yN_z(x \geq 0, y \geq 0, x+y>0, z>0)$ layer 91 may be from 2.5 Å to 50 Å. The reason why the thickness is thinly limited is that if the $Si_xC_yN_z(x \geq 0, y \geq 0, x+y>0, z>0)$ layer 91 having a thickness of over 50 Å is inserted into the active layer 41, the quality of the active layer 41 can be abruptly degraded while excessive strain is accumulated within the active layer 41.

FIG. 11 is a table showing the electrical and optical properties of the III-nitride semiconductor light emitting device according to the second embodiment of the present invention. Sources for growing the $Si_xC_yN_z(x \geq 0, y \geq 0, x+y>0, z>0)$ layer 91 included DTBsi of 1 micro mole per minute, CBr$_4$ of 7 micro mole per minute, and NH$_3$ of 8 linters per minute. A growth time was 10 seconds, and an expected growth thickness was approximately 2.5 Å to 5 Å.

The $Si_xC_yN_z(x \geq 0, y \geq 0, x+y>0, z>0)$ layer 91 is inserted into a central portion of each of all the barrier layers except for the barrier layer that is the nearest to the p-type nitride semiconductor layer 50. A growth temperature was 900° C., which was the same as that of the barrier layer.

As stated above, in order to minimize the memory effect of the sources due to the $Si_xC_yN_z(x \geq 0, y \geq 0, x+y>0, z>0)$ layer 91, there was a purge time of over 1 minute in a high gas flow after the $Si_xC_yN_z(x \geq 0, y \geq 0, x+y>0, z>0)$ layer 91 is grown.

A light emitting device according to the second embodiment of the present invention and a light emitting device without the $Si_xC_yN_z(x \geq 0, y \geq 0, x+y>0, z>0)$ layer 91 showed significant difference in a measured wavelength on photoluminescence (PL). In the case of the light emitting device into which the $Si_xC_yN_z(x \geq 0, y \geq 0, x+y>0, z>0)$ layer 91 is inserted, it was found that the measured wavelength on PL reduced about 5 nm to 10 nm. It is considered that this is caused by the same principle as that described in the first embodiment.

The detailed growth condition applied in FIGS. 9 to 11 is as follows. MOCVD method was used using a C face of a sapphire substrate as a main face. H$_2$ and/or N$_2$ were used as carrier gases. The pressure of a reactor while growing a III-nitride semiconductor was maintained between 100 Torr to 500 Torr.

A GaN layer was first grown as a buffer layer on the sapphire substrate at a temperature of 550° C., and was then grown at a temperature of 1050° C. When the GaN layer was grown at the temperature of 550° C., TMG (50 sccm) and NH$_3$ (15000 sccm) were used as sources. At this time, the GaN layer was grown 300 Å in thickness. On the other hand, when the GaN layer was grown at the temperature of 1050° C., TMG (250 sccm) and NH$_3$ (18000 sccm) were used as the source. At this time, the GaN layer was grown to a thickness of 2 μm.

An n-type GaN layer was then grown as an n-type nitride semiconductor layer at a temperature of 1050° C. In this case, TMG (250 sccm) and NH$_3$ (18000 sccm) were used as sources, and the n-type GaN layer was grown 2 μm in thickness. SiH$_4$ (8 sccm) was used as an n-type dopant.

An In$_{0.15}$Ga$_{0.85}$N layer was then grown as a light emitting layer at a temperature of 800° C. At this time, TMIn (400 sccm), TMG (30 sccm), and NH$_3$ (28000 sccm) were used as the sources, and the In$_{0.15}$Ga$_{0.85}$N layer was grown 25 Å in thickness.

Thereafter, an In$_{0.01}$Ga$_{0.99}$N layer was grown as a barrier layer at a temperature of 900° C. At this time, TMIn (20 sccm), TMG (30 sccm), and NH$_3$ (28000 sccm) were used as the source, and the In$_{0.01}$Ga$_{0.99}$N layer was grown 50 Å in thickness.

A Si$_x$C$_y$N$_z$(x≧0, y≧0, x+y>0, z>0) layer was then grown at a temperature of 1000° C. At this time, DTBSi (1 micro-mole/min), CBr$_4$ (7 micro-mole/min), and NH$_3$ (8 l/min) were used as sources, and the Si$_x$C$_y$N$_z$(x≧0, y≧0, x+y>0≦z>0) layer was grown for 10 seconds.

Then, an In$_{0.01}$Ga$_{0.99}$N layer was grown as a barrier layer at a temperature of 900° C. At this time, TMIn (20 sccm), TMG (30 sccm), and NH$_3$ (28000 sccm) were used as the source, and the In$_{0.01}$Ga$_{0.99}$N layer was grown 50 Å in thickness.

The light emitting layer, the barrier layer, the Si$_x$C$_y$N$_z$ (x≧0, y≧0, x+y>0, z>0) layer, and the barrier layer were then respectively grown twice in an alternate manner under the same growth condition as above.

An In$_{0.15}$Ga$_{0.85}$N layer was then grown as a light emitting layer at a temperature of 800° C. At this time, TMIn (400 sccm), TMG (30 sccm), and NH$_3$ (28000 sccm) were used as the source, and the In$_{0.15}$Ga$_{0.85}$N layer was grown 25 Å in thickness.

Next, an In$_{0.01}$Ga$_{0.99}$N layer was grown as a barrier layer at a temperature of 900° C. At this time, TMIn (20 sccm), TMG (30 sccm), and NH$_3$ (28000 sccm) were used as the sources, and the In$_{0.01}$Ga$_{0.99}$N layer was grown 100 Å in thickness.

Finally, a p-type GaN layer was grown as a p-type nitride semiconductor layer at a temperature of 1000° C. At this time, TMG (100 sccm) and NH$_3$ (18000 sccm) were used as sources, and the p-type GaN layer was grown 2000 Å in thickness. CP$_2$Mg (500 sccm) was used as a p type dopant.

THIRD EMBODIMENT

Figure 12:
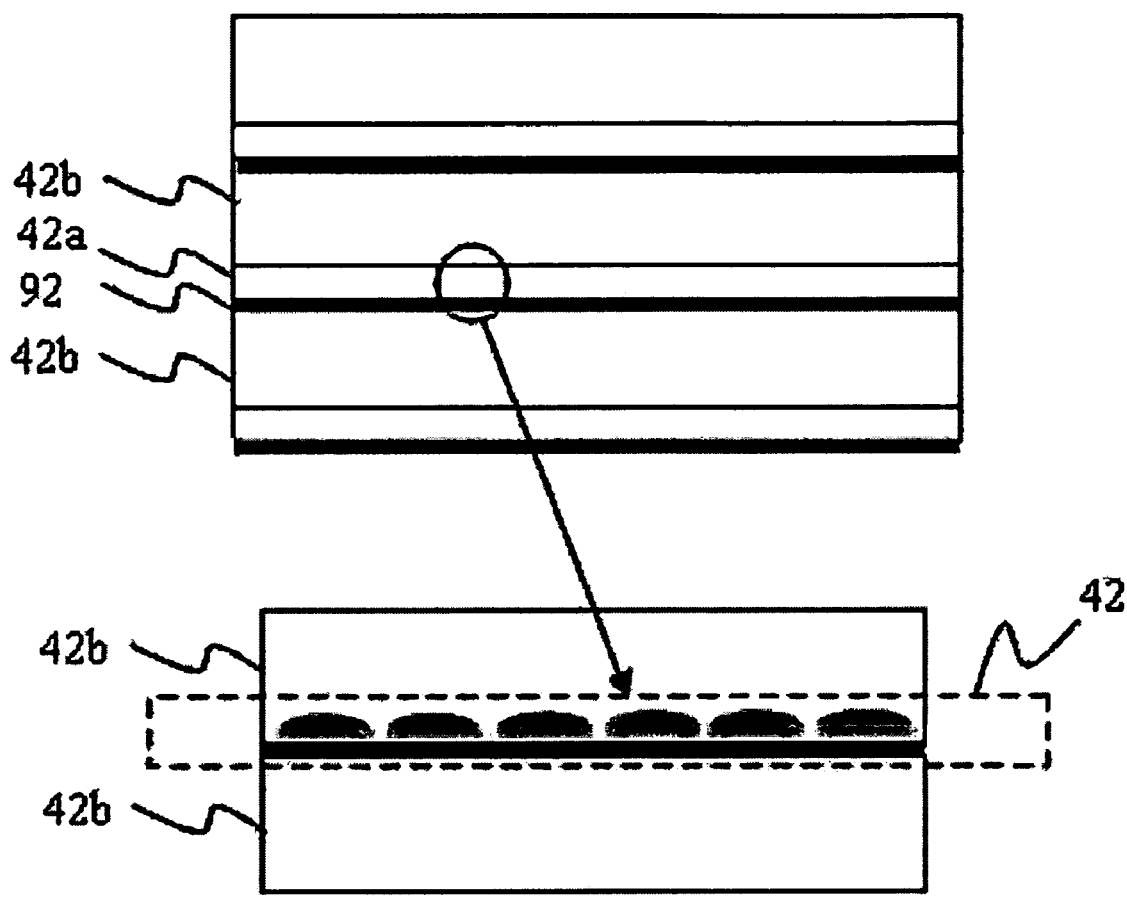
FIG. 12 is an expanded view of the active layer of the III-nitride semiconductor light emitting device according to a third embodiment of the present invention.

FIG. 12 is an expanded view of the active layer 42 of the III-nitride semiconductor light emitting device according to a third embodiment of the present invention. The III-nitride semiconductor light emitting device according to the third embodiment is one of the III-nitride semiconductor light emitting device according to the second embodiment. In the second embodiment, the Si$_x$C$_y$N$_z$(x≧0, y≧0, x+y>0, z>0) layer 91 is located within the barrier layer 41b (see FIG. 10). In this structure, however, a Si$_x$C$_y$N$_z$(x≧0, y≧0, x+y>0, z>0) layer 92 is located at the end of a barrier layer 42b and is thus adjacent to a light emitting layer 42a.

In this case, the Si$_x$C$_y$N$_z$(x≧0, y≧0, x+y>0, z>0) layer 92 serves to directly decide the shape of the light emitting layer 42a. Thus, the Si$_x$C$_y$N$_z$(x≧0, y≧0, x+y>0, z>0) layer 92 and the light emitting layer 42a can be conceptually considered as an integral one, and thus considered as one light emitting layer 42 located between the barrier layers 42b and 42b. This constitutes the first aspect of the present invention.

As described above, there is a sufficient purge time after the growth of the Si$_x$C$_y$N$_z$(x≧0, y≧0, x+y>0, z>0) layer 92. Thus, degradation in the performance of the light emitting device can be prevented. At this time, the purge condition may be different depending upon an active layer growth condition. It is, however, preferred that the growth of the thin film is stopped for a given time in a low-pressure and high-speed gas flow and then waits, as possible.

Meanwhile, the light emitting layer 42a according to the third embodiment can be formed to have a three-dimensional active layer having a quasi quantum dot shape, which is more significant than those of the first embodiment or the second embodiment.

It is preferred that a thickness of the Si$_x$C$_y$N$_z$(x≧0, y≧0, x+y>0, z>0) layer 92 has a value of 2.5 Å to 10 Å. This is because if the thickness of the Si$_x$C$_y$N$_z$(x≧0, y≧0, x+y>0, z>0) layer 92 increases since the Si$_x$C$_y$N$_z$(x≧0, y≧0, x+y>0, z>0) layer 92 directly affects the shape of the light emitting layer 42a, the quality of the light emitting layer 42a can be degraded and emission efficiency can be degraded accordingly.

FOURTH EMBODIMENT

In the first and second embodiments, the III-nitride semiconductor light emitting device is formed using the buffer layer 20 using the GaN layer. In the fourth embodiment, however, a non-single crystal SiC seed layer is grown to a thickness of 5 to 200 Å at a temperature of 600 to 990° C., an In$_x$Ga$_{1-y}$N (0≦x≦1, 0≦y<1, 0≦x+y≦1) layer is grown 100 to 500 Å in thickness on the SiC seed layer at a temperature of 400 to 900° C., and a p-type nitride semiconductor layer 50 is grown using TMG as a Ga growth source at a temperature of 700 to 1100° C. At this time, DMHy and NH$_3$ are used as source as a N growth source, the mole ratio of DMHy/TMG ranges from 1 to 300, and the mole ratio of NH$_3$/TMG ranges from 100 to 8000. Thus, a III-nitride semiconductor light emitting device having a thickness of 10 Å to 10000 Å is obtained.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:

1. A III-nitride semiconductor light emitting device comprising:
   a substrate; and,
   a plurality of nitride semiconductor layers being grown on the substrate and having an active layer for generating photons through recombination of electrons and holes, wherein the active layer includes a light emitting layer that generates photons through recombination of electrons and holes, and a barrier layer which is grown on the light emitting layer and confines the electrons and holes to the light emitting layer, and wherein the light emitting layer includes a $Si_xC_yN_z(x \geq 0, y \geq 0, x+y>0, z>0)$ layer, and a nitride semiconductor layer which is grown on the $Si_xC_yN_z(x \geq 0, y \geq 0, x+y>0, z>0)$ layer and includes Ga and N.

2. The III-nitride semiconductor light emitting device of claim 1, wherein the nitride semiconductor layer including Ga and N is formed as a plurality of three-dimensional islands due to the $Si_xC_yN_z(x \geq 0, y \geq 0, x+y>0, z>0)$ layer.

3. The III-nitride semiconductor light emitting device of claim 1, wherein the nitride semiconductor layer including Ga and N is made of $In(x)Ga(1-x)N(0<x \leq 1)$.

4. The III-nitride semiconductor light emitting device of claim 1, wherein the barrier layer has a band gap energy larger than that of the nitride semiconductor layer including Ga and N.

5. The III-nitride semiconductor light emitting device of claim 1, wherein the growth temperature of the $Si_xC_yN_z$ $(x \geq 0, y \geq 0, x+y>0, z>0)$ layer ranges from 400° C. to 1100° C.

6. The III-nitride semiconductor light emitting device of claim 1, wherein the thickness of the $Si_xC_yN_z(x \geq 0, y \geq 0, x+y>0, z>0)$ layer ranges from 2.5 Å to 10 Å.

7. The III-nitride semiconductor light emitting device of claim 1, wherein the active layer includes a plurality of stacked structures and each of stacked structures is composed of the light emitting layer and the barrier.

8. The III-nitride semiconductor light emitting device of claim 7, wherein the uppermost light emitting layer of the plurality of stacked structures is composed of a nitride semiconductor layer including GaN and N without the $Si_xC_yN_z(x \geq 0, y \geq 0, x+y>0, z>0)$ layer.

9. The III-nitride semiconductor light emitting device of claim 8, wherein the nitride semiconductor layer including Ga and N is made of $In(x)Ga(1-x)N(0<x \leq 1)$.

10. The III-nitride semiconductor light emitting device of claim 1, wherein the silicon source of the $Si_xC_yN_z(x \geq 0, y \geq 0, x+y>0, z>0)$ layer is at least one selected from the group consisting of DTBSi, $SiH_4$ and $Si_2H_6$, the carbon source of the $Si_xC_yN_z(x \geq 0, y \geq 0, x+y>0, z>0)$ layer is at least one selected from the group consisting of $CBr_4$, $CCl_4$, and $CH_4$, and the nitrogen source of the $Si_xC_yN_z(x \geq 0, y \geq 0, x+y>0, z>0)$ layer is at least one selected from the group consisting of $NH_3$ and a hydrazine-based source material.

11. a III-nitride semiconductor light emitting device comprising:
a substrate;
a plurality of nitride semiconductor layers being grown on the substrate and having an active layer with one or more light emitting layers emitting light through recombination of electrons and holes; and,
a $Si_xC_yN_z(x \geq 0, y \geq 0, x+y>0, z>0)$ layer which is located under a light emitting layer located at the farthest from the substrate among the one or more light emitting layers and is not brought into contact with the substrate.

12. The III-nitride semiconductor light emitting device of claim 11, wherein the $Si_xC_yN_z(x \geq 0, y \geq 0, x+y>0, z>0)$ layer is located within a range of 0.5 μm from the active layer.

13. The III-nitride semiconductor light emitting device of claim 11, wherein the $Si_xC_yN_z(x \geq 0, y \geq 0, x+y>0, z>0)$ layer is located under the active layer.

14. The III-nitride semiconductor light emitting device of claim 13, wherein the $Si_xC_yN_z(x \geq 0, y \geq 0, x+y>0, z>0)$ layer is located within a range of 0.5 μm from the active layer.

15. The III-nitride semiconductor light emitting device of claim 11, wherein the $Si_xC_yN_z(x \geq 0, y \geq 0, x+y>0, z>0)$ layer is located within the active layer.

16. The III-nitride semiconductor light emitting device of claim 15, wherein the active layer comprises a barrier layer, the barrier layer being located under a light emitting layer located at the farthest from the substrate among the one or more light emitting layers, having a band gap energy larger than that of the light emitting with which the barrier layer is brought into contact, and including the $Si_xC_yN_z(x \geq 0, y \geq 0, x+y>0, z>0)$ layer.

17. The III-nitride semiconductor light emitting device of claim 11, wherein a light emitting layer that is located over the $Si_xC_yN_z(x \geq 0, y \geq 0, x+y>0, z>0)$ layer and is located at the nearest from the $Si_xC_yN_z(x \geq 0, y \geq 0, x+y>0, z>0)$ layer among the one or more light emitting layers, is composed of a plurality of islands.

18. The III-nitride semiconductor light emitting device of claim 11, wherein the growth temperature of the $Si_xC_yN_z$ $(x \geq 0, y \geq 0, x+y>0, z>0)$ layer ranges from 400° C. to 1100° C.

19. The III-nitride semiconductor light emitting device of claim 13, wherein the thickness of the $Si_xC_yN_z(x \geq 0, y \geq 0, x+y>0, z>0)$ layer ranges from 2.5 Å to 500 Å.

20. The III-nitride semiconductor light emitting device of claim 15, wherein the thickness of the $Si_xC_yN_z(x \geq 0, y \geq 0, x+y>0, z>0)$ layer ranges from 2.5 Å to 500 Å.

21. The III-nitride semiconductor light emitting device of claim 16, wherein the $Si_xC_yN_z(x \geq 0, y \geq 0, x+y>0, z>0)$ layer is located at the uppermost portion of the light emitting layer.

22. The III-nitride semiconductor light emitting device of claim 21, wherein the $Si_xC_yN_z(x \geq 0, y \geq 0, x+y>0, z>0)$ layer is associated with the light emitting layer with which the $Si_xC_yN_z(x \geq 0, y \geq 0, x+y>0, z>0)$ layer is directly contacted, and the associated light emitting layer and $Si_xC_yN_z(x \geq 0, y \geq 0, x+y>0, z>0)$ layer form a light emitting layer.

23. The III-nitride semiconductor light emitting device of claim 21, wherein the thickness of the $Si_xC_yN_z(x \geq 0, y \geq 0, x+y>0, z>0)$ layer ranges from 2.5 Å to 10 Å.

24. The III-nitride semiconductor light emitting device of claim 11, wherein the silicon source of the $Si_xC_yN_z(x \geq 0, y \geq 0, x+y>0, z>0)$ layer is at least one selected from the group consisting of DTBSi, $Si_2H_4$ and $SiH_6$, the carbon source of the $Si_xC_yN_z(x \geq 0, y \geq 0, x+y>0, z>0)$ layer is at least one selected from the group consisting of $CBr_4$, $CCl_4$, and $CH_4$, and the nitrogen source of the $Si_xC_yN_z(x \geq 0, y \geq 0, x+y>0, z>0)$ layer is at least one selected from the group consisting of $NH_3$ and a hydrazine-based source material.

25. The III-nitride semiconductor light emitting device of claim 11, at least one of the one or more light emitting layers is made of $In(x)Ga(1-x)N(0<x \leq 1)$.

* * * * *